United States Patent [19]

Hill

[11] Patent Number: 4,598,853

[45] Date of Patent: Jul. 8, 1986

[54] OPEN-CENTER FLEXURAL PIVOT WIRE BONDING HEAD

[75] Inventor: William H. Hill, Carlsbad, Calif.

[73] Assignee: Hughes Aircraft Company, Los Angeles, Calif.

[21] Appl. No.: 612,293

[22] Filed: May 21, 1984

[51] Int. Cl.$^4$ .............................................. B23K 37/02
[52] U.S. Cl. ...................................... 228/4.5; 228/10; 228/45; 267/160
[58] Field of Search ...................... 228/4.5, 45, 9–11; 267/160, 165

[56] References Cited

U.S. PATENT DOCUMENTS

| | | | |
|---|---|---|---|
| 2,177,398 | 10/1939 | Aller | 74/469 |
| 2,901,284 | 8/1959 | Page | 267/160 |
| 2,920,498 | 1/1960 | Federn | 74/470 |
| 3,408,061 | 10/1968 | Meyer | 267/160 |
| 3,543,988 | 12/1970 | Kulicke, Jr. | 228/4.5 |
| 3,941,486 | 3/1976 | Tyler | 228/4.5 |
| 4,051,830 | 11/1977 | Gruber | 125/11 R |
| 4,438,880 | 3/1984 | Smith | 228/1.2 |
| 4,497,465 | 10/1984 | Yeakly et al. | 248/266 |

FOREIGN PATENT DOCUMENTS

| | | | |
|---|---|---|---|
| 1334446 | 7/1963 | France. | |
| 138852 | 10/1980 | Japan | 228/4.5 |

Primary Examiner—Nicholas P. Godici
Assistant Examiner—Samuel M. Heinrich
Attorney, Agent, or Firm—Joseph E. Szabo; Anthony W. Karambelas

[57] ABSTRACT

A flexural pivot structure useful in a wire bonding machine bonding head (10) is disclosed and includes first and second leaf spring assemblies (39,41) which provide a pivot axis (PA) displaced from the pivoting structure. Each leaf spring assembly includes leaf spring arms (39a,39b,41a,41b) extending outwardly from a central mounting position (39c,41c) so that each assembly forms a truncated vee. The center portions of the leaf springs are secured to a transducer bridge (25) in which a transducer (59) is mounted. The ends of the leaf springs are secured in a bracket (11) with respect to which the transducer (59) pivots about an axis located at the intersection of converging lines along the leaf springs (39a,39b,41a,41b) of each leaf spring assembly (39,41).

7 Claims, 9 Drawing Figures

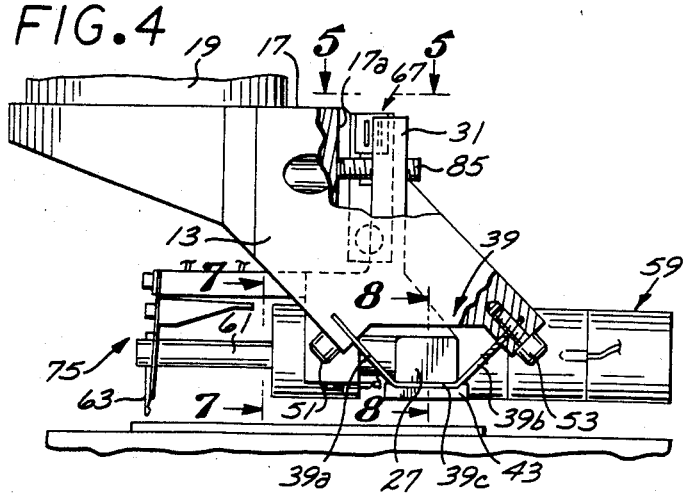
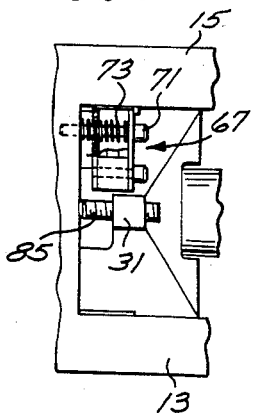
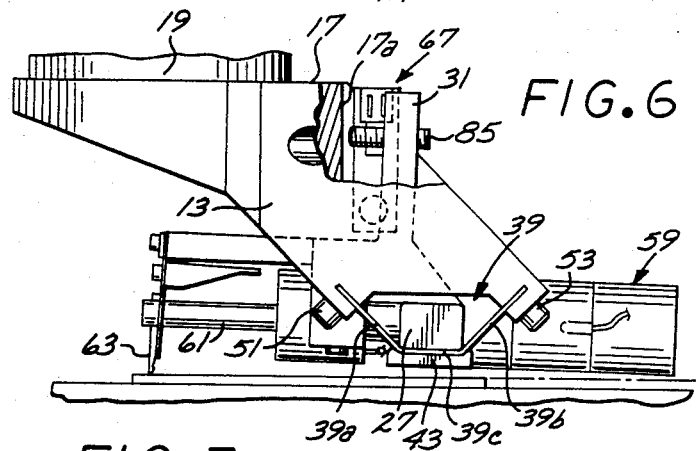
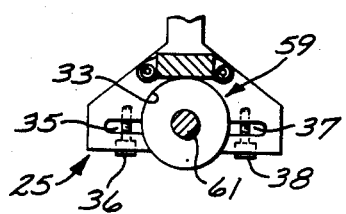
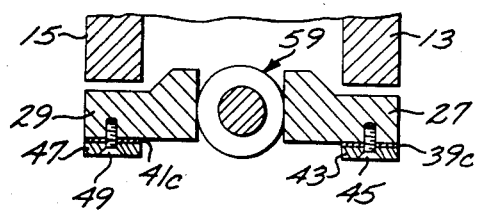
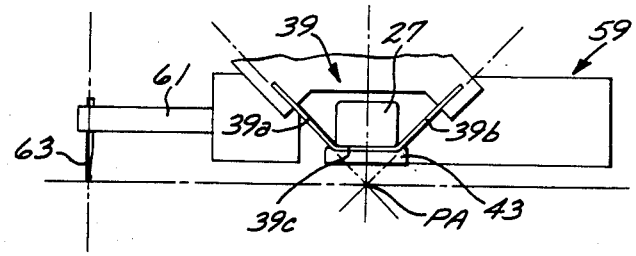

OPEN-CENTER FLEXURAL PIVOT WIRE BONDING HEAD

BACKGROUND OF THE INVENTION

1. Field of the Invention

The disclosed invention generally relates to pivot structures, and particularly to a flexural pivot structure which is particularly useful in apparatus for bonding thin wire leads in microelectronic circuits.

2. Background Art

In the manufacture of microelectronic circuit packages, certain electrical connections are made with extremely thin gold or aluminum wires. For example, connections between a semiconductor integrated circuit chip and the package leads are typically made with such thin wires. As another example, active elements in semiconductor hybrid circuits may be interconnected with extremely thin wire.

The attachment of interconnecting thin wires is typically accomplished with wire bonding machines which supply wire and make the connections of the opposite ends of the wire leads. Generally, a wire bonding machine includes a bonding head which can move vertically, horizontally and rotatably about a vertical axis. A transducer (e.g., an ultrasonic transducer) is pivotally mounted to the bonding head so as to pivot about a horizontal axis, preferably at the center of gravity of the transducer and its mount. The transducer includes an arm portion with a bonding tool at its end. The bonding tool is raised and lowered relative to the work piece by vertical movement of the bonding head. When the bonding tool contacts and withdraws from the work piece, the transducer arm pivots. Ideally, in the vicinity of contact with the work piece, the bonding tool should travel in a straight line perpendicular to the workpiece bonding surface.

In presently known systems, due to clearance requirements, transducer arm pivot structures are mounted to constantly remain above the plane of the work piece. Therefore, the pivot action resulting from lowering and raising the bonding tool will cause undesirable tip skid due to non-perpendicular motion in the vicinity of contact with the workpiece. In some present systems, the effects of tip skid are reduced, but not eliminated, by having long transducer arm portions between the pivot axis of the transducer arm and the bonding tool. However, such long arm portions result in more difficult control of the positioning of the bonding tool. Moreover, if the bonding tool requires specific positions to accomplish wire feed between the first and second bonds, a long transducer arm would possibly make such required positions difficult, if not impossible.

SUMMARY OF THE INVENTION

It is therefore an object of the invention to provide a flexural pivot structure which has an effective pivot axis displaced from the pivot structure.

It is also an object of the invention to provide an improved flexural pivot structure which does not utilize bearings or bushings.

Another object of the invention is to provide a flexural pivot structure which is compact and has an open center pivot.

Still another object of the invention is to provide a flexural pivot structure which is useful in wire bonding apparatus.

A further object of the invention is to provide a flexural pivot structure useful in wire bonding apparatus and which allows for a transducer pivot axis to be coplanar with the bonding region.

It is also an object of the invention to provide an improved wire bonding apparatus which includes an easily positioned shorter transducer arm.

Another object of the invention is to provide an improved wire bonding apparatus which avoids tip skid.

Still another object of the invention is to provide a means of loading a bonding tool by the forces of deflecting flexure elements.

The foregoing and other objects and purposes are accomplished in a pivot structure which includes a first set of inclined leaf springs and a second set of inclined leaf springs parallel to the first set of leaf springs. The leaf springs in each set are inclined to form an included angle of 90 degrees or less and have their closest ends spaced apart and fastened to a bridge in which the transducer arm is mounted. The distal ends in each set of leaf springs are mounted in a bracket which remains stationary relative to the pivoting action afforded by the leaf springs. More specifically, each set of leaf springs is a unitary leaf spring assembly formed in the shape of a truncated vee, which is secured to the bridge along its center flat portion. The effective pivot axis is located at the intersection of the converging line segments extending along the arm portions of the truncated vee formed by each leaf spring pair.

BRIEF DESCRIPTION OF THE DRAWING

The advantages and features of the disclosed invention will be readily appreciated by persons skilled in the art from the following detailed description when read in conjunction with the drawing wherein:

FIG. 4 is a side elevational view of the bonding head of FIG. 1 positioned with the bonding tool above the work piece.

FIG. 5 is a detail top plan view of an optical sensing structure utilized in the bonding head of FIG. 1.

FIG. 6 is a side elevational view of the bonding head of FIG. 1 positioned with the bonding tool in contact with the work piece.

FIG. 7 is a partial cross-sectional elevational view of the bonding head of FIG. 1 and taken along the section lines 7—7 in FIG. 4.

FIG. 8 is a partial cross-sectional elevational view of the bonding head of FIG. 1 taken along the section lines 8—8 in FIG. 4.

FIG. 9 is a partial elevational view of the bonding head of FIG. 1 and shows the geometry of the disclosed flexural pivot of the invention.

DETAILED DESCRIPTION

Figure 1:
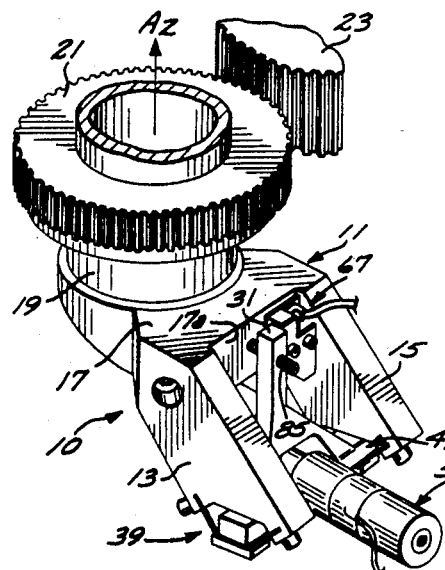
FIG. 1 is a perspective view of a wire bonding machine bonding head which utilizes the open center flexural pivot of the disclosed invention.
Figure 2:
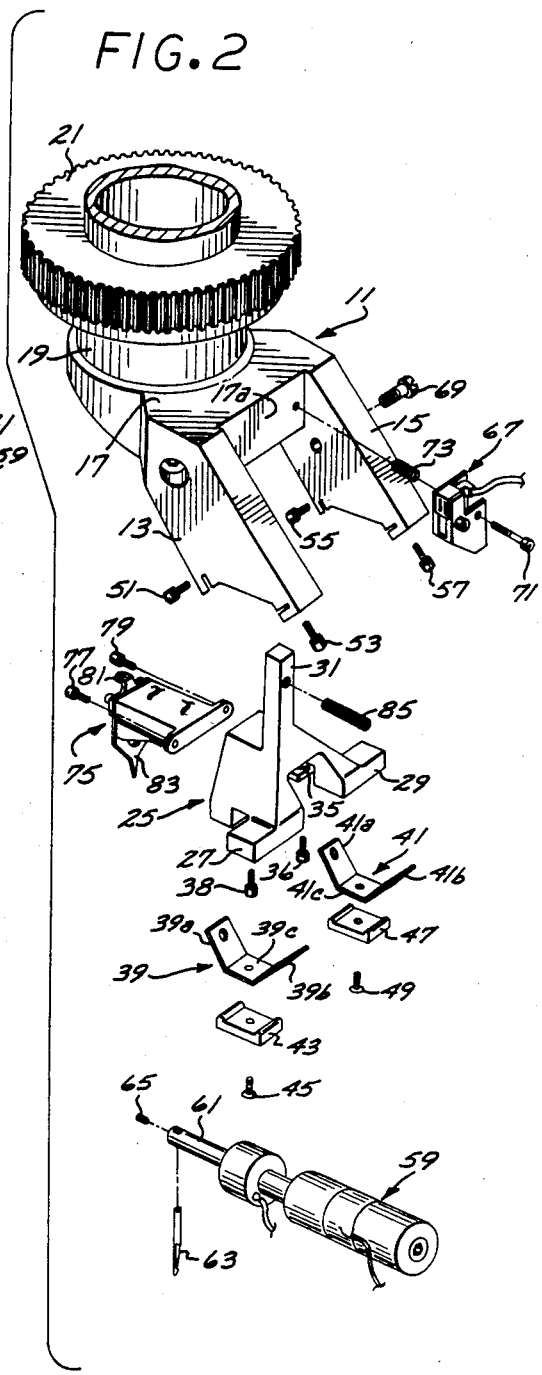
FIG. 2 is an exploded perspective view of the bonding head of FIG. 1.
Figure 3:
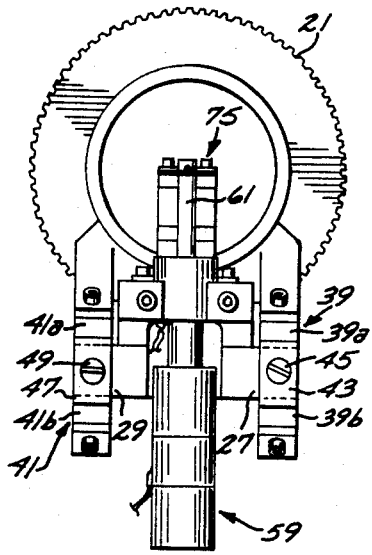
FIG. 3 is a bottom plan view of the bonding head of FIG. 1.

In the following detailed description, like elements shown in the several figures of the drawing will be identified with like reference numerals. Also, for illustration purposes, the following description will generally be in the context of a wire bonding machine bonding head but will be readily appreciated as providing teachings applicable to other apparatus utilizing pivoting structures.

Referring now to the several figures of the drawing, shown therein is a wire bonding machine bonding head 10 which includes a bracket 11 having a pair of parallel arms 13 and 15. The upper portions of the arms 13 and 15 terminate in a cross-member 17 which has a vertical surface 17a between the arms 13 and 15. The bracket 11 is coupled to a cylindrical shaft 19 which is mounted in a bearing or bushing assembly (not shown) which would allow the shaft 19 to rotate about the axis Az. Mounted on the shaft 19 is a gear 21 which engages another gear 23. Actuation of the gear 23 by appropriate apparatus (not shown) will cause the bracket 11 to rotate about the axis Az.

The bonding head 10 further includes a transducer supporting bridge 25 which includes opposing arms 27 and 29. The bridge 25 is formed so that the arms 27 and 29 merge with the body of the bridge which tapers into a four-sided, elongated vertical member 31. As discussed further below, the vertical member 31 is utilized for sensing the angular position of the transducer mounted in the bridge 25. The body of the bridge 25 further includes a bore 33 which has a cross-section of less than a full circle. Opening into the bore from opposite sides are two lateral U-shaped openings 35 and 37.

The bridge 25 is coupled to the arms 13 and 15 of the bracket 11 by the leaf spring assemblies 39 and 41. Each leaf spring assembly 39 and 41 includes outwardly extending leaf springs 39a and 39b, and 41a and 41b. Each leaf spring assembly also includes a flat center mounting portion 39c and 41c between the respective leaf springs. The leaf springs and the center mounting portions of the leaf spring assemblies 39 and 41 are flat with mounting holes in each portion.

The leaf spring assembly 39 is fastened to the bottom of the transducer bridge 27 by a clamp 43 and a fastener 45 which secure the center portion 39c of the leaf spring assembly 39 against the bottom of the bridge arm 27. The leaf spring assembly 41 is fastened to the bridge 25 by a clamp 47 and a fastener 49 which secure the center portion 41c of the leaf spring assembly 41 against the bottom of the bridge arm 29.

The arms 39a and 39b of the leaf spring assembly 39 are respectively mounted in slots in the bracket arm 13 and are secured with fasteners 51 and 53. The arms 41a and 41b of the leaf spring assembly 41 are respectively mounted in slots in the bracket arm 15 and are secured with fasteners 55 and 57.

A transducer 59 is mounted within the bore 33 of the bridge 25. The transducer 59 is secured in the bridge by a pair of fasteners 36 and 38, which when tightened tend to reduce the size of the openings 35 and 37 and thereby clamp the transducer 59 within the bore 33. By way of example, the transducer 59 is an ultrasonic transducer which includes an arm portion 61 and a bonding tool 63 mounted at right angles at the end of the arm 61. The bonding tool 63 is secured with a fastener 65.

Referring now to FIG. 9, illustrated therein is the geometry of the flexural pivot provided by the leaf spring assemblies 39 and 41. Specifically, as shown relative to the leaf spring assembly 39, the pivot axis PA is located at the intersection of lines extending downwardly from the leaf springs 39a and 39b. Flexure of the leaf springs of the leaf spring assemblies 39 and 41 by movement of the transducer bridge 25 will cause pivoting about the pivot axis PA. With a bonding tool 63 of appropriate length, the pivot axis PA is coplanar with the tip of the bonding tool 63.

The included angle formed by the leaf spring arms of the leaf spring assemblies 39 and 41 are shown as being approximately 90 degrees. However, smaller included angles could be utilized to achieve a more compact structure.

Effectively, the bracket 11 is a yoke for pivotally supporting the transducer assembly including the transducer bridge 25 and the transducer 59. As a result of the leaf spring assemblies 39 and 41, the pivot axis of the transducer assembly is displaced from the pivoting structure hardware.

Although the foregoing description of the disclosed flexural pivot has been relative to a pair of leaf spring assemblies 39 and 41, it is readily apparent that in certain uses a single leaf spring assembly may be sufficient.

Mounted on the bracket 11 adjacent the vertical surface 17a is an optical sensor module 67 which includes a light emitting diode (LED) source and a photo transistor sensor. The optical sensor module 67 is pivotally fastened to the bracket arm 15 by a fastener 69. The position of the optical sensor relative to the vertical surface 17a is controlled with a threaded fastener 71 which slidably passes through the optical sensor module 67 and engages a threaded bore in the bracket 11. A compression spring 73 is mounted on the fastener between the optical sensor module 67 and the vertical surface 17a and tends to bias the optical sensor module 67 away from the vertical surface 17a. The location of the optical sensor module 67 relative to the vertical surface 17a is controlled by the depth of engagement of the fastener 71 in the bracket 11.

The top portion of the elongated vertical member 31 of the bridge 25 is adjacent the optical sensor module 67 and provides a reflecting surface for making or breaking the optical path between the LED and photo transistor contained within the optical sensor module 67. The position of the elongated vertical member 31 will vary as the bridge 25 pivots on the leaf spring assemblies 39 and 41.

An adjustable stop member 85 is adjustably engaged in the elongated member 31, and can be adjusted to press against the vertical surface 17a to pre-load the leaf spring assemblies 39 and 41 to a desired spring torque. For example, a spring torque pre-load equivalent to 20 grams at the bonding tool 63 may be set by adjustment of the stop 85. As the bonding head 10 is lowered vertically, when the bonding tool 63 contacts the work piece, the 20 grams is transferred from the stop 85 to the tip of the bonding tool 63. Downward overtravel beyond the point of transfer will increase the bonding force. For example, to obtain a bonding force of 30 grams with a pre-load of 20 grams, overtravel of a known amount would be required. Accordingly, with the above-described flexural pivot support for the transducer 59, bonding force is easily controlled. Because of the coplanar relation of the pivot axis PA and the tip of the bonding tool 63, the amount of overtravel is not critical relative to tip-skid.

In operation, the adjustment stop 85 is adjusted for a predetermined pre-load. The position of the optical sensor 67 is then adjusted with the fastener 71 so that it will sense contact of the bonding tool 63 with the work piece. Once contact with the work piece is detected, the desired amount of overtravel is provided by appropriate control of the vertical displacement of the bonding head 10.

As shown in the drawing, the bonding head 10 also includes an electromagnetic wire clamp assembly 75 which is fastened by fasteners 77 and 79 to the transducer bridge 25 and above the bonding tool 63. The wire clamp assembly 75 includes an aperture 81 which functions as a wire guide, and also includes a clamping arm 83 which is selectively actuated to press against the bonding tool so that the bonding wire can be clamped.

Although the foregoing has been a description of preferred embodiments of the disclosed invention, various changes and modifications can be made thereto by persons skilled in the art within the spirit and scope of the invention as defined by the following claims.

What is claimed is:

1. A bonding head for a wire bonding machine comprising:
    a support bracket having first and second bracket arms,
    means for supporting a bonding transducer with a bonding tool, said supporting means having first and second outwardly extending arms;
    first resilient means for resiliently deforming and having a center portion attached to said first outwardly extending arm and leaf springs extending from said center portion, said leaf springs being attached to said first bracket arm; and
    second resilient means for resiliently deforming and having a center portion attached to said second outwardly extending arm and leaf springs extending from said center portion, said leaf springs being attached to said second bracket arm, said first and second resilient means cooperatively providing for said transducer supporting means a pivot axis displaced from said center portions attached to said transducer supporting means.

2. The bonding head of claim 1 wherein each said first and second resilient means comprise a leaf spring assembly having leaf spring arms and a center portion between said leaf spring arms, said leaf spring arms and center portion forming a truncated vee.

3. The bonding head of claim 2 wherein the leaf spring arms of each said leaf spring assembly form an included angle of approximately 90 degrees or less.

4. The bonding head of claim 1 further including means for applying a pre-load force to said first and second resilient means such that said pre-load force is transferred to the bonding tool upon its contact with a workpiece.

5. The bonding head of claim 4 wherein said means for pre-loading comprises an adjustable stop interposed between said support bracket and said transducer supporting means.

6. The bonding head of claim 5 further including means for sensing the occurrence of contact of the bonding tool with the work piece to provide information utilized to control overtravel of the bonding head.

7. The bonding head of claim 6 wherein said sensing means comprises optical sensing means responsive to the position of said transducer supporting means relative to said support bracket.

* * * * *